(12) United States Patent
Karns et al.

(10) Patent No.: US 11,650,168 B2
(45) Date of Patent: May 16, 2023

(54) RESONANT WAVEGUIDE CAVITY SYSTEM FOR COMPLEX PERMITTIVITY MEASUREMENTS

(71) Applicant: Battelle Memorial Institute, Columbus, OH (US)

(72) Inventors: Duane Clifford Karns, Mays Landing, NJ (US); James Christopher Weatherall, Linwood, NJ (US); Jeffrey Brian Barber, Vineland, NJ (US); Barry Thomas Smith, Egg Harbor City, NJ (US); Zachary J. Landicini, Vineland, NJ (US)

(73) Assignee: Battelle Memorial Institute, Columbus, OH (US)

( * ) Notice: Subject to any disclaimer, the term of this patent is extended or adjusted under 35 U.S.C. 154(b) by 0 days.

(21) Appl. No.: 17/025,600

(22) Filed: Sep. 18, 2020

(65) Prior Publication Data

US 2021/0088457 A1 Mar. 25, 2021

Related U.S. Application Data

(60) Provisional application No. 62/903,120, filed on Sep. 20, 2019.

(51) Int. Cl.
*G01N 22/00* (2006.01)
*H01P 7/06* (2006.01)

(52) U.S. Cl.
CPC ............... *G01N 22/00* (2013.01); *H01P 7/06* (2013.01)

(58) Field of Classification Search
None
See application file for complete search history.

(56) References Cited

U.S. PATENT DOCUMENTS

| 9,741,521 | B1* | 8/2017 | Perkins | H01J 23/11 |
|---|---|---|---|---|
| 2005/0150278 | A1* | 7/2005 | Troxler | G01N 33/42 |
| | | | | 73/78 |
| 2016/0146742 | A1* | 5/2016 | Chang | G01N 22/00 |
| | | | | 324/633 |
| 2016/0146872 | A1* | 5/2016 | Weatherall | G01N 22/00 |
| | | | | 324/633 |

* cited by examiner

*Primary Examiner* — Nasima Monsur
(74) *Attorney, Agent, or Firm* — Benesch, Friedlander, Coplan & Aronoff LLP

(57) ABSTRACT

A method of using a resonant cavity for measuring a complex permittivity ε and identifying of a sample (solid or liquid) of microliter volume size includes using a network analyzer to measure over a defined millimeter wave frequency range, a first resonance frequency at a cavity resonance mode, and calculating an unloaded quality factor of an enclosed resonant waveguide cavity of a defined internal dimensions, placing a sample on a surface of a bottom wall of the resonant waveguide cavity and measure a second resonance frequency and calculating a loaded quality factor; determining, a resonance frequency shift $\Delta f=(f_s-f_o)$, determining a complex permittivity ε of the sample according to the resonance frequency shift $\Delta f$, the loaded quality factor, the unloaded quality factor and the defined internal dimensions; and identifying the sample using a database through the complex permittivity ε.

58 Claims, 5 Drawing Sheets

RESONANT WAVEGUIDE CAVITY SYSTEM FOR COMPLEX PERMITTIVITY MEASUREMENTS

CROSS-REFERENCE

This disclosure claims priority to and the benefit from U.S. Provisional Patent Application Ser. No. 62/903,120 titled "Resonant Waveguide Cavity System For Complex Permittivity Measurements", filed on Sep. 20, 2019, which is herein incorporated by reference in its entirety.

GOVERNMENT SPONSORSHIP

This invention was made with support by the U.S. Department of Homeland Security under government contract number (QTO 3) 70RSAT18Q00000003. The government has certain rights in the invention.

TECHNICAL FIELD

This disclosure generally relates to Resonant Waveguide Cavity System for Complex Permittivity Measurements of sub-microliter samples.

BACKGROUND

Unknown samples (solids or liquids) may be characterized and identified through measuring their physical properties, one of which is permittivity ε (also known as dielectric constant), an ability to store an electric field. A common method to derive the permittivity ε is through measuring a capacitance C of the unknown sample, which C and e are related by a parallel plate capacitance equation:

$$C = \varepsilon^*(A/d)$$

where A is a plate area and d is a distance separating between the two parallel plates. As the volume or the size of the unknown sample reduces to a minute size which becomes difficult to handle, it may not be practical to construct parallel plates small enough to sandwich the sample for a capacitance measurement.

SUMMARY

A method, a resonant cavity and a system for measuring a complex permittivity of a sample (solid or liquid) of microliter volume size is disclosed. The system utilizes a unique very sensitive resonant cavity measurement system capable of detecting and characterizing small volumes of sample in the millimeter wave frequency range. Sample volumes as small as 0.1 microliter may be characterized in a normal laboratory or field environment where large sample sizes may not be practical or available. The required sensitivity is achieved through a uniquely designed resonant cavity measurement system that operates in the millimeter wave frequency range which the sample may be directly placed on a bottom surface of the resonant cavity, thus eliminating a traditional requirement of using a fixture to suspend the sample inside of the resonant cavity to improve sensitivity in electric field perturbation measurement. An absence of a fixture in the resonant cavity eliminates measurement errors introduced by the additional structure of the fixture, thus rendering the measured complex permittivity ε of the sample with improved accuracy and speed. Application of the resonant cavity complex permittivity ε measurement of a sample may be found in detection of trace amount of explosives, narcotics, banned substances and tissues, etc.

DETAILED DESCRIPTION

Figure 1A:
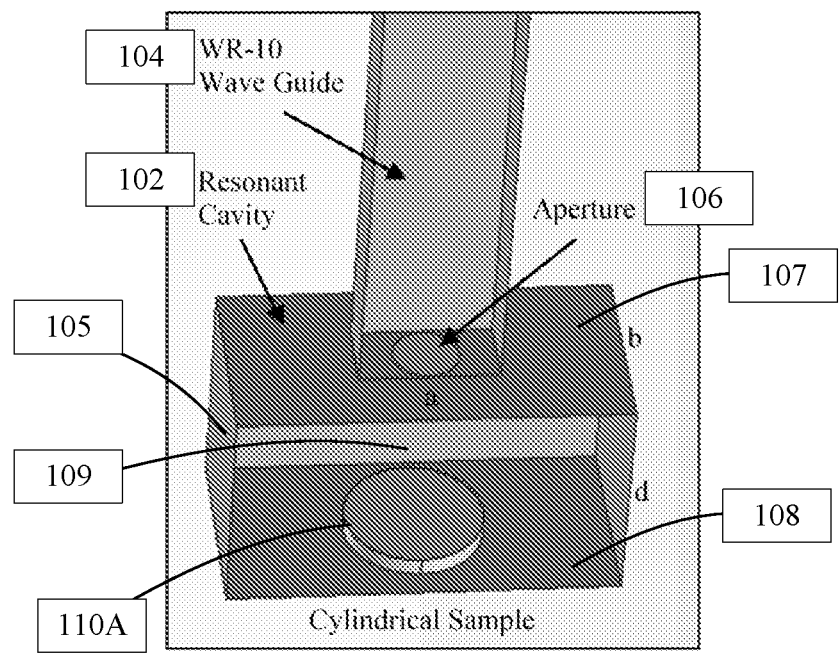
FIGS. 1A and 1B depict an exemplary resonant waveguide cavity design which is used for measuring complex permittivity ε of various sample geometries.

FIG. 1A depicts an exemplary resonant waveguide cavity 102 designed for measuring complex permittivity ε of a sample (110A or 110B) which may be approximated to be of cylindrical geometry in one embodiment. The resonant waveguide cavity 102 was designed for the measurement of the complex permittivity ε of solid or liquid samples in the frequency range of 75 GHz-110 GHz using a section of WR-28 waveguide. In one embodiment, the resonant waveguide cavity 102 has internal dimensions of a=7.112 mm in the x-direction, b=3.556 mm in the y-direction, and d=4.0 mm in the z-direction. An end wall (e.g., bottom wall) 108 may be sealed with a flat metallic plate so it can hold liquids without leaking. A centered aperture 106 in the xy-plane at a top wall 107 couples to the cavity with the input waveguide. In an embodiment, the coupling aperture 106 has a diameter of 1.2 mm and is 0.127 mm thick. A WR-10 waveguide 104 may be used as the input waveguide.

The resonant waveguide cavity 102 may also be referred to as an Upside Down resonant cavity. FIG. 1 shows an illustration of the resonant waveguide cavity 102 assembly with a front surface 109 of the assembly removed so that the coupling aperture 106 and the idealized sample 110A are visible.

The resonant frequency modes ($f_{mnp}$) of the resonant waveguide cavity 102 with Ideal Sample Resonant Frequency Analysis may be given by equation (1):

$$f_{mnp} = \frac{c}{2\sqrt{\mu\varepsilon}} \left( \frac{m^2}{a^2} + \frac{n^2}{b^2} + \frac{p^2}{ct^2} \right)^{\frac{1}{2}}, \quad (1)$$

where m, n and p are resonant mode integers, and $\mu$ and $\epsilon$ are the relative permeability and relative permittivity of the material in the cavity 102, respectively.

Quality Factor Analysis

The quality factor (Q) of a resonant cavity 102 may be calculated from equation (2):

$$Q = \omega \frac{W}{P}, \quad (2)$$

where $\omega$ is the angular frequency, W is the total time-average energy stored in the cavity and P is the time-average power loss over a cycle.

A time-average power loss for a resonant cavity 102 with a dielectric medium (such as air) and a coupling aperture 106 may be further divided into three categories. The three categories are dielectric medium permittivity loss ($P_d$), wall resistivity loss ($P_w$), and coupling aperture loss ($P_c$) as shown in equation (3):

$$Q = \omega \frac{W}{P_d + P_w + P_c}. \quad (3)$$

The quality factor can be rewritten as equation (4):

$$\frac{1}{Q} = \left(\frac{1}{Q_d} + \frac{1}{Q_w} + \frac{1}{Q_c}\right), \quad (4)$$

where the quality factor due to the dielectric medium permittivity loss is $Q_d$, to the wall resistivity loss is $Q_w$ and to the coupling aperture loss is $Q_c$. Furthermore, $Q_d$ is commonly related to the complex permittivity ($\epsilon = \epsilon' + i\epsilon''$) of the dielectric medium in equation (5):

$$Q_d = \frac{\epsilon'}{\epsilon''}. \quad (5)$$

A wall resistivity loss is commonly found in literature for the specific case of the $TE_{10p}$ resonant mode [7]. However, for the purpose of this research, $Q_w$ was expanded to include general cases of $TE_{mnp}$ and $TM_{mnp}$, shown in equations (6) and (7):

$$Q_{wTE} = \frac{Z_0 abd}{4R_s} \frac{k_{xy}^2 k_{xyz}^3}{\zeta ad(k_{xy}^4 + \kappa_x^2 \kappa_Z^2) + \zeta bd(k_{xy}^4 + \kappa_y^2 \kappa_Z^2) + abk_{xy}^2 k_Z^2}, \quad (6)$$

$$Q_{wTM} = \frac{Z_0 abd}{4R_s} \frac{k_{xy}^2 k_{xyz}}{b(\gamma a + d)k_x^2 + a(\gamma b + d)k_y^2}, \quad (7)$$

where $R_s$ is the surface resistance and $Z_0$ is the free space characteristic impedance:

$$k_x = \frac{m\pi}{a}, k_y = \frac{n\pi}{b}, k_z = \frac{p\pi}{d},$$

-continued $$k_{xy} = \sqrt{k_x^2 + k_y^2}, k_{xyz} = \sqrt{k_x^2 + k_y^2 + k_z^2},$$

$$\zeta = \begin{cases} 1, m \neq 0 \\ 1/2, m = 0 \end{cases}, \xi = \begin{cases} 1, n \neq 0 \\ 1/2, n = 0 \end{cases}, \text{and } \gamma = \begin{cases} 1, p \neq 0 \\ 1/2, p = 0 \end{cases}.$$

Lastly, $Q_c$ was adapted from the case of the $TE_{10p}$ resonant mode with a separate input and output coupling aperture to the case of a single input/output coupling aperture as shown in equation (8):

$$Q_c = \frac{2.24 \times 10^{-2}}{r^6}\left(\frac{b^2 d^2}{p^4} + \frac{a^2 b^2 d^2}{p^2}\right), \quad (8)$$

where r is the radius of the coupling aperture.

Perturbation Technique Analysis

Perturbation techniques allow the complex permittivity of a material to be determined by examining the change in the resonance frequency and the quality factor introduced by a material into the resonant cavity. The underlying assumption of cavity perturbation theory is that the electromagnetic fields inside the cavity 102 are only changed by a very small amount with the introduction of the sample material (110A or 110B) and the change can be neglected. Maxwell's equations for the original cavity and the perturbed (or loaded) cavity can then be used to derive expressions for the resulting resonant frequency shift and quality factor change. Usually, the resonant cavity 102 is air-filled before it is perturbed (or loaded) with the material of interest. Furthermore, the material of interest is usually placed in the center of the cavity 102. In this general case, and a transverse electric field with resonant mode integer values of m=1, n=0 and p>0 ($TE_{10p}$), the equations describing the change in the complex permittivity $\epsilon$ are expressed as follows equations (9, 10):

$$\epsilon_s' = \frac{V_0(f_0 - f_s)}{2V_s f_s} + 1, \quad (9)$$

$$\epsilon_s'' = \frac{V_0(Q_0 - Q_s)}{4V_s Q_0 Q_s}, \quad (10)$$

where $\epsilon_s'$ and $\epsilon_s''$ are the real and imaginary parts of the complex permittivity $\epsilon$ for the perturbation material of interest. The resonant frequency $f_0$ and quality factor $Q_0$ refer to the unperturbed (or unloaded) resonant cavity, and $f_s$ and $Q_s$ refer to the values perturbed (or loaded) by the sample (110A or 110B). The volume $V_0$ is the full volume of the cavity and $V_s$ is the volume of the sample (110A or 110B).

However, the Upside Down waveguide resonant cavity 102 is different. The sample (110A or 110B) is not placed in the center of the cavity 102. It allows the sample or material to be placed directly on the bottom 108 of the cavity 102. Therefore, the sample or material can be characterized without a need for a fixture. Placing the sample (110A or 110B) at the bottom 108 of the cavity without a fixture does create a problem, however. For example, the shape of the sample (110A or 110B) cannot be controlled through a sample cut-out in the fixture.

In an embodiment, the idealized sample 110A shape of a cylinder does not occur in practice. The shape the liquid forms on the bottom 108 of the Upside Down waveguide resonant cavity 102 is mostly a function of the liquid's surface energy and the wetting angle the liquid forms with the surface. Generally, the liquid forms a shape similar to a cylinder 110B on the bottom surface 108 of the Upside Down resonant cavity 102. However, the final shape may be more like a three-quarter sphere or cylinder.

Figure 1B:
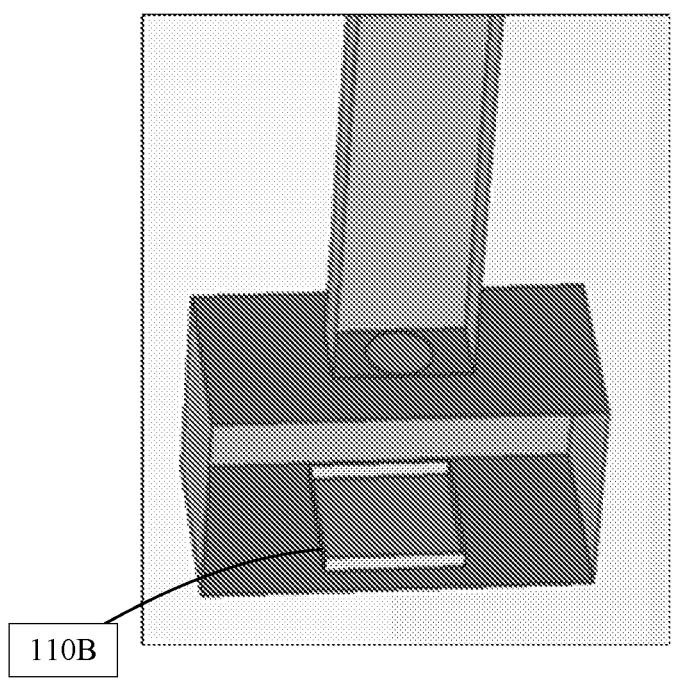

It may be assumed that the shape would be a rectangular cuboid 110B for simple derivation of the perturbation equations. FIG. 1B illustrates the Upside Down resonant cavity 102 with the front surface 109 of the assembly removed. This may allow the idealized cuboid 110B samples to be visible.

The assumption of a cuboid instead of a cylinder or a hemisphere leads to a small volume error that has to be accounted for with a correction factor. The volume error between a cuboid 110 and a cylinder 110A of the same height and width is calculated to be $4/\pi$. Therefore, the volume of the cuboid 110B may be $4/\pi$ larger than the volume of a cylinder 110A. Further, the volume error between a cuboid and a hemisphere of the same width and height is calculated to be $6/\pi$. So, the volume of the cuboid may be $6/\pi$ larger than the volume of a hemisphere.

As shown in FIG. 1A, the sample 110A may be approximated with a cylindrical sample and in FIG. 1B, the sample 110B may be approximated as a cuboid. Nevertheless, an actual shape of the sample 110A may be just a droplet having a geometry somewhere between a cylinder and a hemisphere, so the volume difference may be somewhere between $4/\pi$ and $6/\pi$. Currently, there is no clear way to fully determine the shape of a sample droplet, but the area in the xy-plane may be estimated from microscope images of the sample droplet. The area, along with the calculated height of the sample droplet (110A or 110B), may be used to estimate a correction factor required to compensate for the volume error.

Another aspect of the current embodiment of permittivity measurement using the Upside Down resonant cavity 102 which is different from other resonant cavity measurement is that the $TE_{10p}$ resonant mode is not used. Instead, the current embodiment using the Upside Down resonant cavity 102 uses the transverse magnetic TM field with resonant mode integer values of m=1, n=2 and p=0 (i.e., $TM_{120}$). This $TM_{120}$ mode is better suited for the sample (110A or 110B) placement at the bottom 108 of the Upside Down resonant waveguide cavity 102. More specifically, the E-field distribution (212 or 214) in this $TM_{120}$ mode is uniform in the z-direction (see FIGS. 2A to 2C), which allows the sample 110A or 110B to be moved from the center of the Upside Down resonant waveguide cavity 102 to the bottom surface 108.

Figure 2A:
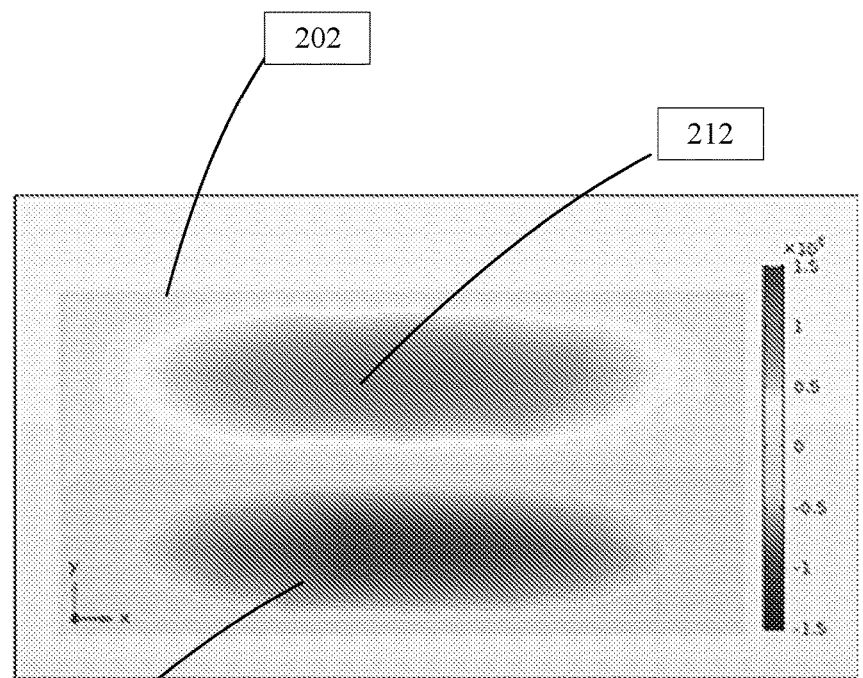
FIG. 2A depicts an Ez-field distribution on XY-plane in the resonant waveguide cavity for the $TM_{120}$ mode, when viewed from the top.
Figures 2B, 2C:
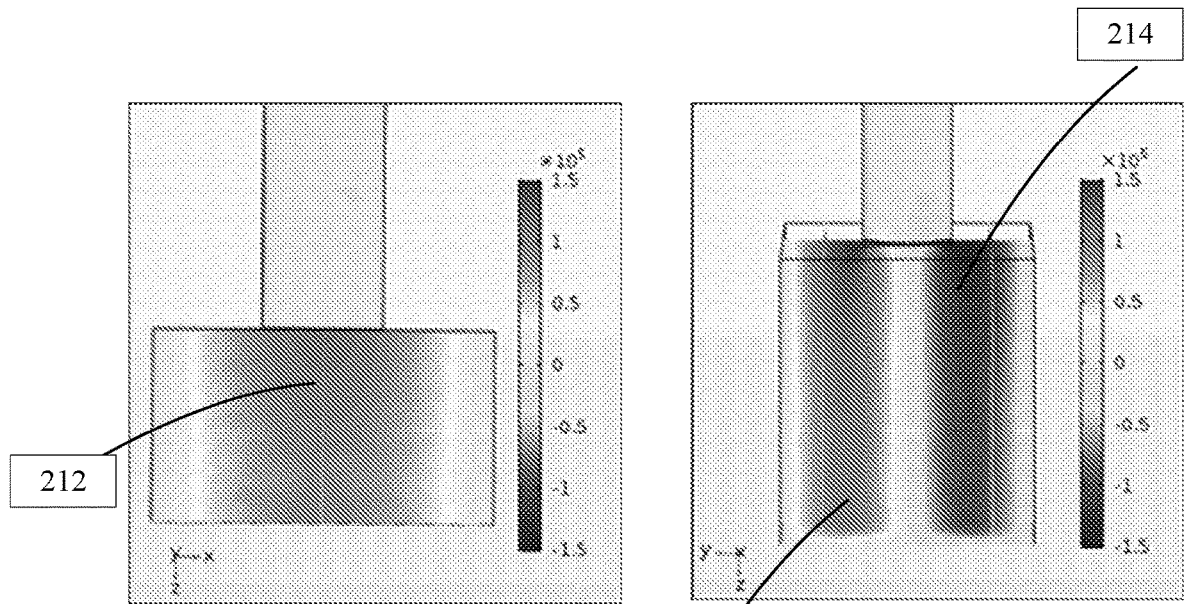
FIG. 2B depicts an Ez-field distribution on XZ-plane for the $TM_{120}$ mode, when viewed from a front side of the resonant waveguide cavity.
FIG. 2C depicts an Ez-field distribution on YZ-plane for the $TM_{120}$ mode, when viewed from a left side of the resonant waveguide cavity.

A full frequency swept model of the air-filled Upside Down resonant cavity 102 assembly in a simulation software COMSOL™ was used to produce images of the E-field distributions (212, 214). For example, FIG. 2A depicts an Ez-field distribution (212 or 214) on XY-plane in the resonant waveguide cavity 102 for the $TM_{120}$ mode, when viewed from the top 107. The x-component and the y-component of the E-field are zero for this resonant cavity configuration. The field strength is indicated by the color bar is in the units of V/m. The $E_z$-field distribution is observed to be uniform in the z-direction, have a single central peak in the x-direction, and have two peaks (212, 214) in the y-direction. This $E_z$-field distribution is expected from a transverse magnetic field with resonant mode integers m, n, and p equal to 1, 2, and 0 respectively. A uniform $E_z$-field distribution in the z-direction is ideal when the sample is placed at the bottom 109 of the resonant cavity 102. FIG. 2B depicts an $E_z$-field distribution 212 on XZ-plane for the $TM_{120}$ mode, when viewed from a front side 109 of the resonant waveguide cavity 102. FIG. 2C depicts an $E_z$-field distribution (212 and 214) on YZ-plane for the $TM_{120}$ mode, when viewed from a left side 105 of the resonant waveguide cavity 102.

The Upside Down resonant cavity does not allow the sample to be placed in the center of the cavity and it uses $TM_{120}$ mode instead of $TE_{10p}$. Therefore, the equations describing the change in complex permittivity $\varepsilon$ must be updated for the Upside Down resonant cavity configuration and the resonant mode of interest in the W-band. The resonant mode of interest is the $TM_{120}$. A uniform $E_z$-field throughout the depth of the cavity is present when the resonant mode integer p is equal to 0, as it is for a $TM_{120}$ mode. This is very useful for measuring samples placed on the bottom surface 108 of the resonant cavity 102. The resonant frequency for this resonant mode is at approximately 86.5 GHz when the cavity is filled with air (i.e., unloaded resonant frequency). The $E_z$-field distribution in the cavity for this mode is expressed as equations (11, 12):

$$E_z = E_0 \sin\left(\frac{m\pi x}{a}\right)\sin\left(\frac{n\pi y}{b}\right)\cos\left(\frac{p\pi z}{d}\right), \qquad (11)$$

or $$E_z = E_0 \sin\left(\frac{\pi x}{a}\right)\sin\left(\frac{2\pi y}{b}\right)\cos\left(\frac{0\pi z}{d}\right), \qquad (12)$$

where $E_0$ is the E-field amplitude. The change in the complex resonant radian frequency due to the insertion of a cuboid dielectric sample 110B, with a complex permittivity $\varepsilon=\varepsilon'+i\varepsilon''$, at the bottom 109 of the Upside Down resonant cavity 102 is given as follows in equation (13):

$$\frac{\omega_s - \omega_0}{\omega_0} = \frac{-\iiint_{V_{sample}} \Delta\varepsilon |E_z|^2 dv}{\iiint_{V_{cavity}} \varepsilon |E_z|^2 dv} \qquad (13)$$

where $\omega_0$ is the complex resonant radian frequency of the empty cavity (i.e., unloaded resonant radian frequency) and $\omega_s$ is the complex resonant radian frequency of the cavity with the sample of interest (i.e., loaded resonant radian frequency). The cavity volume is $v_{cavity}$ and the sample volume is $v_{sample}$. An integral performed to the numerator of equation (13) is given as follows in equation (14):

$$(\varepsilon - 1)\varepsilon_0 \int_0^a \int_0^b \int_0^t E_0^2 \sin^2\left(\frac{\pi x}{a}\right)\sin^2\left(\frac{2\pi y}{b}\right)\cos^2(0)dzdydx = \qquad (14)$$

$$\frac{(\varepsilon - 1)\varepsilon_0 E_0^2 \left[A\pi + a\sin\left(\frac{A\pi}{a}\right)\right]\left[B\pi - b\sin\left(\frac{B\pi}{b}\right)\right]t}{8\pi^2},$$

where A is the length of the rectangular cuboid 110B in the x-direction or the long (a) dimension of the waveguide. Similarly, B is the length in the y-direction or the short (b) dimension and t is the height of the cuboid 110B in the z-direction or the depth (d) dimension. An integral performed to the denominator of (13) is given as follows in equation (15):

$$\frac{\varepsilon_0 E_0^2 abd}{2} \quad (15)$$

Therefore, for the $TM_{120}$ resonant mode the change in the complex resonant radian frequency due to the insertion of a dielectric sample at the bottom of the Upside Down resonant cavity is given as follows in equation (16) by combining equations (14) and (15):

$$\frac{\omega_s - \omega_0}{\omega_0} = \frac{(1-\varepsilon)t\left[A\pi + a\sin\left(\frac{A\pi}{a}\right)\right]\left[B\pi - b\sin\left(\frac{B\pi}{b}\right)\right]}{4abd\pi^2}. \quad (16)$$

The quality factor Q may be expressed as a complex value which may be related to the complex resonant radian frequency by (17):

$$Q = \frac{\omega_R}{2\omega_i}, \quad (17)$$

where $\omega_R$ is the real part of the complex resonant radian frequency and $\omega_i$ is the imaginary part. Equation (13) may be substituted with the complex value of Q of equation (17) to allow the complex resonant radian frequency to be written in terms of the resonant frequency f and the quality factor Q to become equation (18).

$$\frac{\omega_s - \omega_0}{\omega_0} = \frac{f_s - f_0}{f_0} + \frac{i}{2}\left(\frac{1}{Q_S} - \frac{1}{Q_0}\right), \quad (18)$$

The shift in the resonant frequency and the quality factor due to the insertion of a dielectric sample at the bottom 108 of the Upside Down resonant cavity is shown in equations (19, 20) by combining equations (18) and (16):

$$\frac{f_s - f_0}{f_0} = \frac{(1-\varepsilon')t\left[A\pi + a\sin\left(\frac{A\pi}{a}\right)\right]\left[B\pi - b\sin\left(\frac{B\pi}{b}\right)\right]}{4abd\pi^2}, \quad (19)$$

$$\frac{1}{2}\left(\frac{1}{Q_S} - \frac{1}{Q_0}\right) = \frac{(1-\varepsilon'')t\left[A\pi + a\sin\left(\frac{A\pi}{a}\right)\right]\left[B\pi - b\sin\left(\frac{B\pi}{b}\right)\right]}{4abd\pi^2}. \quad (20)$$

Figure 3:
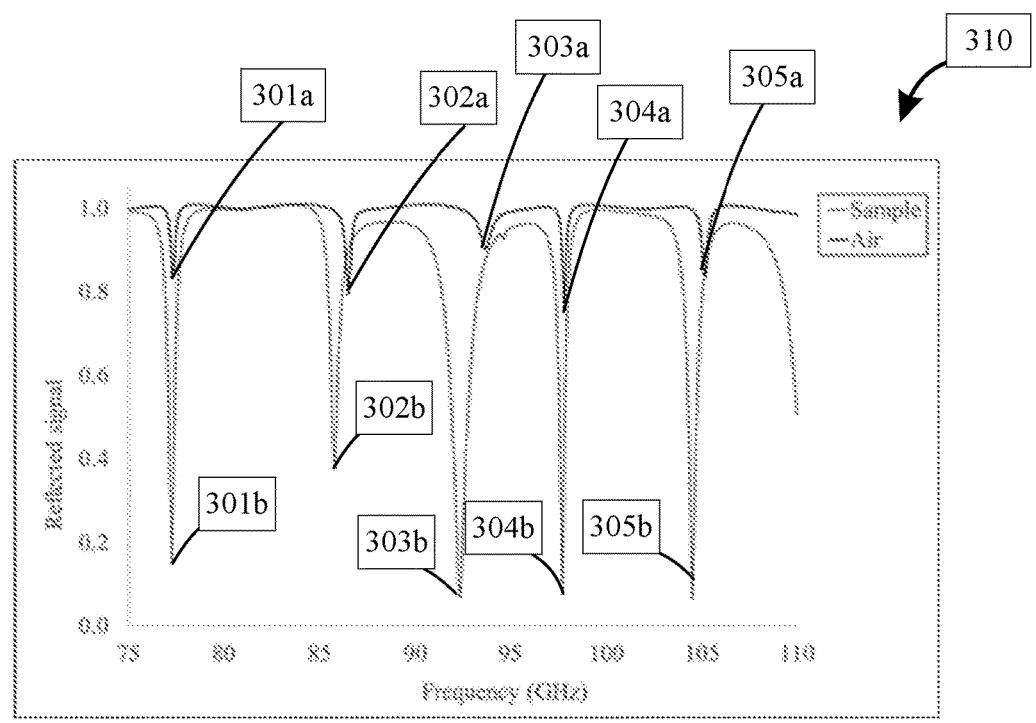
FIG. 3 is a simulated plot showing frequency shifts and locations of resonances when the resonant waveguide cavity is unloaded (without sample) and locations of resonances when loaded.

FIG. 3 is a simulated plot 310 showing frequency shifts and locations of resonances (301a to 305a) when the resonant waveguide cavity 102 is unloaded (without sample) and locations of resonances (301b to 305b) when loaded.

FIG. 3 illustrates the shift in the resonant frequencies (i.e., 301a to 301b to 305a to 305b) and the quality factor ($Q_o$ to $Q_s$) when a sample 110A or 110B is inserted into the air filled Upside Down resonant cavity 102. The simulated data may be produced by COMSOL™ with a full frequency swept model of the Upside Down resonant cavity 102. There are five resonant modes (i.e., 301a to 305a) shown between 75 GHz and 110 GHz. The $TM_{120}$ resonant mode (i.e., 302a) at approximately 86.5 GHz is the resonant mode of interest. Each of the five resonant modes (i.e., 301a to 305a) responds differently when the sample is inserted. They each apply unique E-field distributions to the sample 110A or 110B and experience different corresponding resonant frequency (i.e., 301b to 305b) and quality factor shift.

Figure 4:
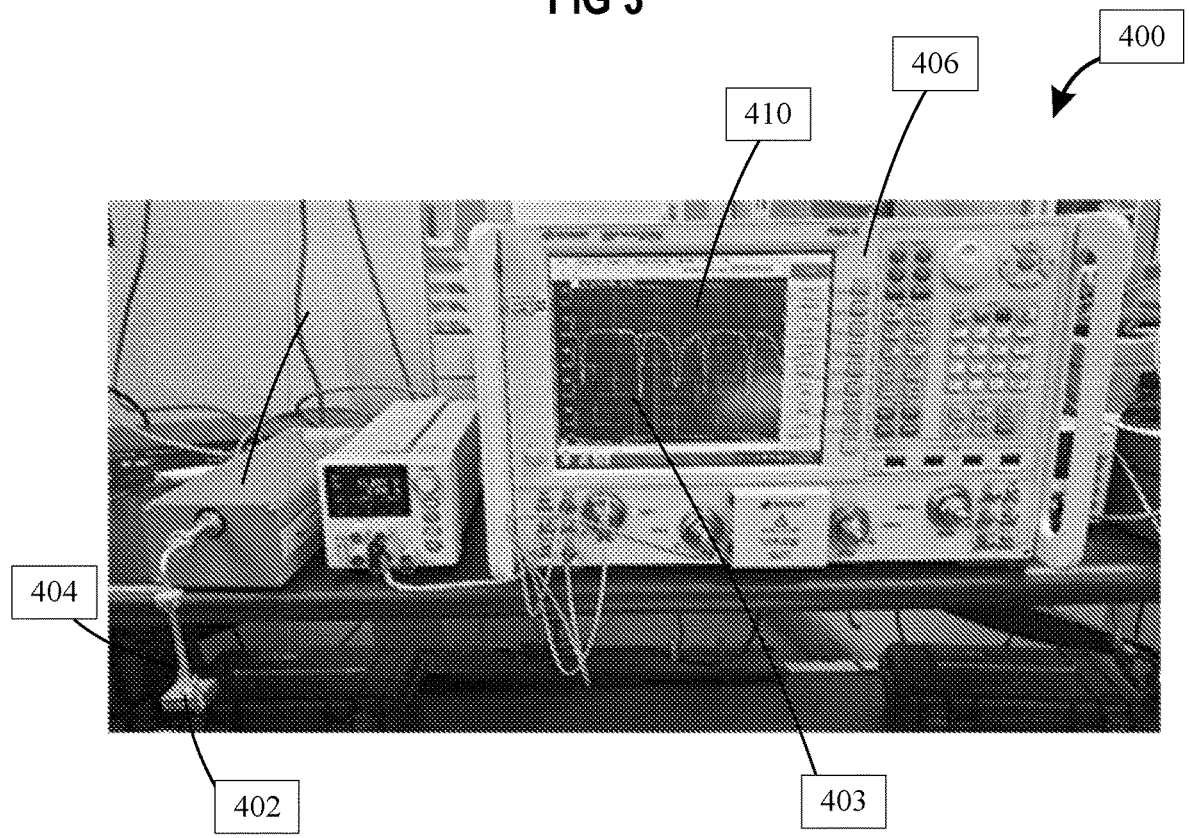
FIG. 4 depicts a set up (system) in actual practice showing an actual measured plot which correlates with the simulated plot on frequency shifts and locations of resonances when the resonant waveguide cavity is unloaded (without sample) and loaded.

FIG. 4 depicts a set up (system) 400 in actual practice showing an actual measured plot 410 which correlates with the simulated plot 310 on frequency shifts and locations of resonances when the resonant waveguide cavity is unloaded (without sample) and when loaded.

Experimental Setup. A Programmable Network Analyzer (PNA-X) 406 (such as a Keysight Programmable Network Analyzer) may be used to measure a reflection coefficient F from the Upside Down resonant cavity 402. However, to achieve the operational frequency range of interest, a frequency extender 408 (such as an OML extender) may be used in order that the operational frequency may be extended to W-band (75 GHz to 110 GHz). The measurement setup 400 may be calibrated with known techniques, such as applying an open, a short and a load calibration standards.

As shown in FIG. 4, a reflection coefficient F may be shown on the PNA-X 406. The $TM_{120}$ resonant mode 403 is indicated for reference. The sampled reflection coefficient F versus frequency data f may be extracted from the PNA-X and fit using a least squares algorithm to the following function in equation (21):

$$ref\ coef = -1 + \frac{2k/(1+k)}{1 + i2Q_L(f - f_r)/f_r} \quad (21)$$

The fitting parameters in (21) are the resonant frequency, $f_r$, the loaded quality factor, $Q_L$ and the coupling coefficient, k. The coupling coefficient is associated with the coupling losses in the measurement system and relates the unloaded quality factor, $Q_0$, to the loaded quality factor by (22)

$$Q_0 = Q_L(1+k). \quad (22)$$

Alternatively, the loaded quality factor $Q_L$ and the resonant frequency $f_r$ 403 may be found by fitting the sampled reflection coefficient Γ data to a simple polynomial function and applying equation (23):

$$Q_L = \frac{f_r}{f_{FWHM}}, \quad (23)$$

where, $f_r$ is the resonant frequency and $f_{FWHM}$ is the full-width-half-maximum frequency (also known as a 3 dB bandwidth). The two techniques (i.e., using reflection coefficient Γ and frequency shift $f-f_r$) for determining $Q_L$ agree well for resonant peaks (301a to 305a and 301b to 305b) that are relatively isolated, such as those shown in FIG. 3.

Once the shift in the resonant frequency $f-f_r$ (i.e., 302a to 302b) and the loaded quality factor $Q_L$ have been determined, the values for ε' and ε" may be calculated from equations (19) and (20) respectively.

Figure 5:
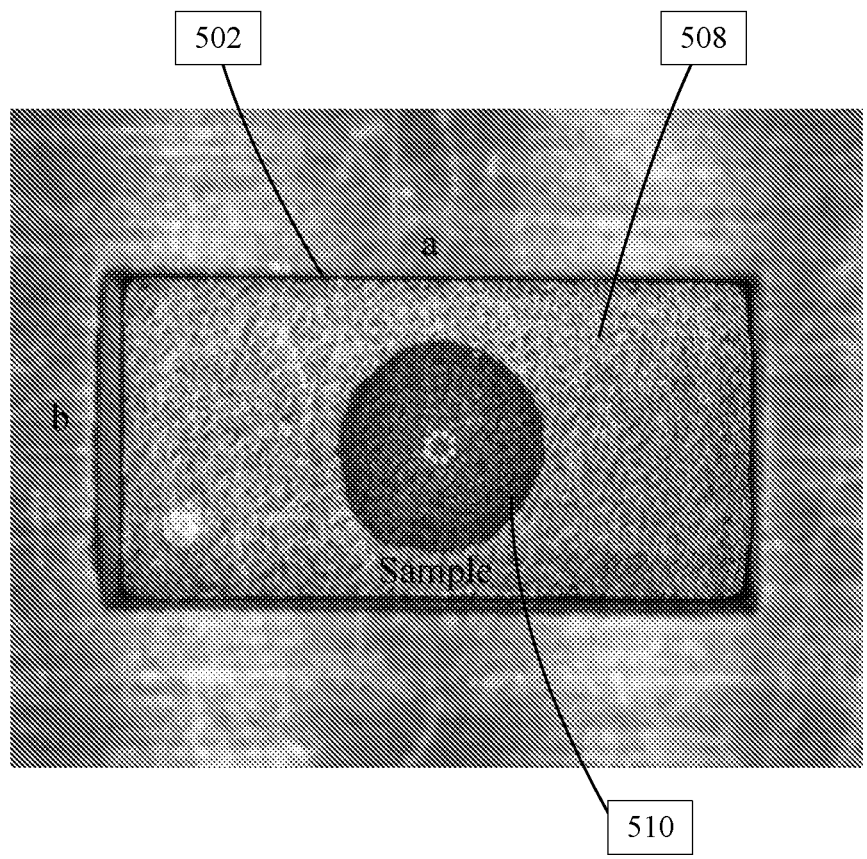
FIG. 5 depicts atop view of a shape of a sample placed on a bottom surface of the resonant waveguide cavity when a top cover is removed.

FIG. 5 depicts a top view of a shape of a sample 510 placed on a bottom surface 508 of the resonant waveguide cavity 502 when a top cover is removed. The sample 510 was measured using the Resonant Waveguide Cavity Measurement System 400 (see FIG. 4) with the (Upside Down) waveguide resonant cavity. FIG. 5 shows a microscope image of the ab-plane (xy-plane) of the (Upside Down)

resonant waveguide cavity 502 with a sample 510 of interest (i.e., a sample droplet) is captured before and after each measurement.

An examination of FIG. 5 shows that the sample 510 droplet may not be perfectly round or perfectly centered. Statistics may be applied to mitigate errors associated with the droplet form and placement. For example, ten samples may be measured to allow for a statistical analysis. Each sample may be carefully placed into the Upside Down resonant cavity 502 using a sub-microliter pipette and then imaged with a microscope before and after the measurement. The microscope images help determine the placement and shape of the sample 510 droplet, since there is variation in the location and form. The shape may vary from a three-quarter sphere to almost a cylindrical shape depending upon the surface tension and wetting angle of the sample 510 liquid droplet. In addition, a variation of approximately 5% in the sample volume may exist due to the small amount required for the measurement and due to an accuracy tolerance of the sub-microliter pipette and due to surface tension of the sample droplet with the sub-microliter pipette.

Perturbation techniques were shown to extract the complex permittivity $\varepsilon$ of the sample for the 10 runs. The reflection coefficient, $\Gamma$, was calculated from the complex permittivity $\varepsilon$ assuming a boundary of air and the solution. The results are shown in.
Table 1.

TABLE 1

Complex Permittivitys and Reflection Coefficient F of the Samples

| Run | $\varepsilon'$ | $\varepsilon''$ | r |
|---|---|---|---|
| 1 | 3.89 | 0.51 | 0.331 |
| 2 | 4.18 | 0.67 | 0.348 |
| 3 | 3.98 | 0.50 | 0.335 |
| 4 | 3.92 | 0.48 | 0.332 |
| 5 | 3.76 | 0.41 | 0.322 |
| 6 | 3.92 | 0.52 | 0.332 |
| 7 | 3.61 | 0.40 | 0.313 |
| 8 | 3.92 | 0.50 | 0.332 |
| 9 | 3.72 | 0.41 | 0.319 |
| 10 | 4.15 | 0.61 | 0.346 |
| AVG | 3.88 | 0.49 | 0.329 |
| STD | 0.16 | 0.08 | 0.016 |

Table 1 shows the measured complex permittivity $\varepsilon$ and the calculated reflection coefficient $\Gamma$ for the 10 data sets. The average and the standard deviation of the data is shown as well. The standard deviation of the measured complex permittivity $\varepsilon$ may be assumed to be the measurement error for them.

Figure 6:
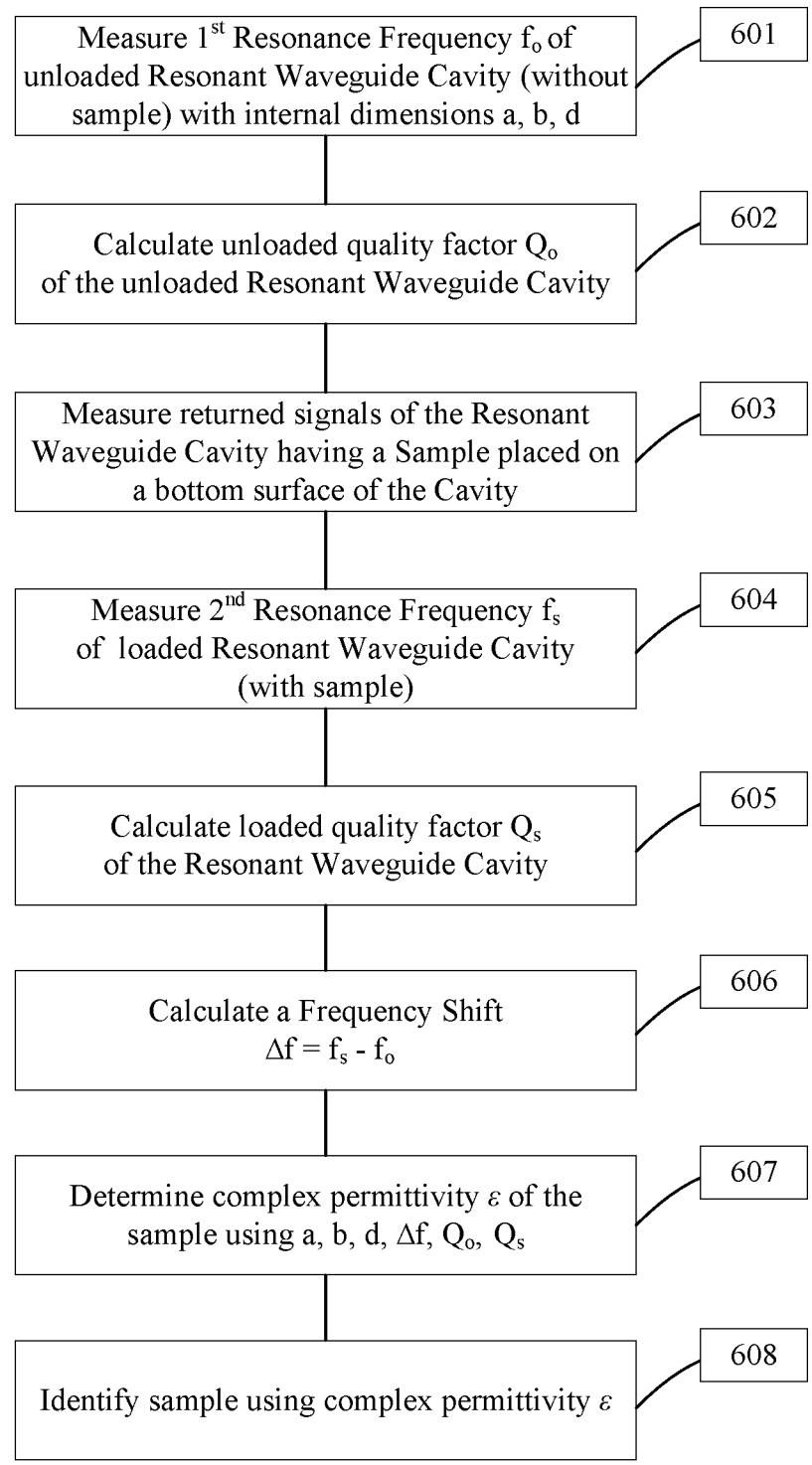
FIG. 6 is a flow chart illustrating an exemplary method to measure a complex permittivity F of a sample using a resonant waveguide cavity.

FIG. 6 is a flow chart illustrating an exemplary method to measure a complex permittivity $\varepsilon$ of a sample using an enclosed resonant waveguide cavity with internal dimensions a, b, d. The measurement set up includes at least a computer having a processor executing an algorithm stored in anon-transitory computer readable memory medium to communicate with a network analyzer which is coupled to the enclosed resonant waveguide cavity to perform operations as follows: In step 601, control the network analyzer to send signals over a defined millimeter wave frequency range to the enclosed resonant waveguide cavity to measure a first resonance frequency $f_0$ of an unloaded resonant waveguide cavity (without sample). In step 602, measure returned signals from the enclosed resonant waveguide cavity and calculate according to the returned signals, an unloaded quality factor $Q_o$ of the unloaded resonant waveguide cavity.

In step 603, send signals over a defined millimeter wave frequency range and measure returned signals from the enclosed resonant waveguide cavity having placed a sample on a bottom surface of the resonant waveguide cavity. In step 604, measure second resonance frequency $f_s$ of the loaded resonant waveguide cavity (with sample). In step 605, calculate loaded quality factor $Q_s$ of the resonant waveguide cavity. In step 606, calculate a frequency shift $\Delta f = f_s - f_o$. In step 607, determine a complex permittivity $\varepsilon$ of the sample using a, b, d, $\Delta f$, $Q_o$, $Q_s$. In step 608, Identify sample using complex permittivity $\varepsilon$. The sample may be a sub-microliter volume sample in one of physical states comprising: a solid state, a liquid state and a gel state.

In an embodiment, the measurements are measured over a defined millimeter wave frequency range operates over a W-band covering 75 GHz to 110 GHz. The resonant waveguide cavity having a resonance mode belongs to one of transverse magnetic field ($TM_{mnp}$) resonance modes, wherein m, n and p are integer values $\geq 0$, and m is associated with the x-direction, n is associated with the y-direction and p is associated with the z-direction.

In an embodiment, the $TM_{mnp}$ resonance mode is a $TM_{120}$ mode having the first resonance frequency $f_o$ at approximately 86.5 GHz. The resonance mode measurement may be made with maximum electric field strengths of the $TM_{120}$ resonance modes which take place at or proximal to wall surfaces of the enclosed resonant waveguide cavity, wherein the maximum electric field strengths of the $TM_{120}$ resonance modes at or proximal to the wall surfaces of the enclosed resonant waveguide cavity may eliminate use of fixturing support to partially or fully suspend the sample away from the surface of the bottom wall. The elimination of fixturing support and the direct placement of the sample on the surface of the bottom wall of the enclosed resonant waveguide cavity may enable the sample to receive maximum electric field strengths and perturbation of electric fields, thus improving sensitivity of the measurement of the resonance frequency shift ($f_s - f_o$) and improving accuracy in complex permittivity $\varepsilon$ determinations for the identifying of the sample.

In an embodiment, the enclosed resonant waveguide cavity supports transverse electric field ($TE_{mnp}$) resonance modes, wherein maximum electric field strengths of the $TE_{mnp}$ resonance modes take place at a distance away from wall surfaces or towards a centroid of the enclosed resonant waveguide cavity. When measurement is made in $TE_{mnp}$ resonance modes, fixturing support may be required in order to partially suspend the sample or to place the sample away from wall surfaces toward the centroid of the enclosed resonant waveguide cavity, such that the sample receiving maximum electric field strengths and perturbation of electric fields.

In an embodiment, after the placement of the sample on the surface of a bottom wall of the enclosed resonant waveguide cavity, the sample may be determined by one or more of: a sample mass, by taking a mass difference of the enclosed resonant waveguide cavity before and after the sample is placed, a change of sample placement location, by comparing the sample placement location in the enclosed resonant waveguide cavity before and after the second resonance frequency $f_s$ is made, a change of sample physical dimensions, by comparing the sample physical dimensions in the enclosed resonant waveguide cavity before and after the second resonance frequency $f_s$ is made. In an embodiment, the change of sample placement location and the change of sample physical dimensions may be measured through optical means such as through a microscope.

What have been described above are examples. It is, of course, not possible to describe every conceivable combination of elements, components, or methods, but one of ordinary skill in the art will recognize that many further combinations and permutations are possible. Accordingly, the disclosure is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A method of microliter volume size sample identification, comprising:
   coupling an enclosed resonant waveguide cavity which is free from sample to a network analyzer, wherein the enclosed resonant waveguide cavity having internal dimensional measurements of a in x-direction, b in y-direction and d in z-direction;
   controlling the network analyzer to send signals over a defined millimeter wave frequency range which operates over a W-band covering 75 GHz to 110 GHz to the enclosed resonant waveguide cavity to measure first returned signals in the defined millimeter wave frequency range from the enclosed resonant waveguide cavity to determine at least a first resonance frequency $f_o$ at a cavity resonance mode;
   determining according to the first returned signals, an unloaded quality factor $Q_o$ of the enclosed resonant waveguide cavity which is free from sample;
   placing the microliter volume size sample on a surface of a bottom wall of the enclosed resonant waveguide cavity, wherein the surface of the bottom wall is at a zero elevation in the z-direction;
   controlling the network analyzer to send the signals over the defined millimeter wave frequency range to the enclosed resonant waveguide cavity loaded with the sample;
   measuring a second returned signals in the defined millimeter wave frequency range from the enclosed resonant waveguide cavity loaded with the sample therein to determine at least a second resonance frequency fs at the cavity resonance mode, and determining according to the second returned signals, a sample loaded quality factor $Q_s$ of the enclosed resonant waveguide cavity;
   determining, a resonance frequency shift ($f_s$-$f_o$) in the defined millimeter wave frequency range, by taking a difference between the second resonance frequency fs and the first resonance frequency $f_o$ at the cavity resonance mode;
   determining a complex permittivity ε=ε'+iε" of the sample according to at least: the resonance frequency shift Δf=($f_s$-$f_o$), the sample loaded quality factor $Q_s$, the unloaded quality factor $Q_o$ and the internal dimensional measurements a, b and d of the enclosed resonant waveguide cavity;
   where ε' is a real part and ε" is an imaginary part; and
   identifying the sample using a database according to the determined complex permittivity ε, wherein the unloaded quality factor $Q_o$ or the sample loaded quality factor $Q_s$ are related by the following equations:

$$Q_0 = Q_L(1+k)$$

$$Q_L = \frac{f_r}{f_{FWHM}}$$

where $Q_o$ is another unloaded quality factor for one of: $Q_s$ and $Q_o$, and the another unloaded quality factor $Q_o$ being free from loading effect or losses caused by measurement set-up and connections to the network analyzer, where $Q_L$ is a pre-loaded quality factor, and the pre-loaded quality factor $Q_L$ including the loading effect or the losses caused by the measurement set-up and connections to the network analyzer, wherein k is a coupling coefficient, where, $f_r$ is the resonant frequency, being one of: $f_s$ and $f_o$; and $f_{FWHM}$ is the full-width-half-maximum frequency or a 3dB frequency bandwidth, wherein the pre-loaded quality factor $Q_L$ is alternately calculated using a least squares algorithm to the following function:

$$ref\ coef = -1 + \frac{2k/(1+k)}{1 + i2Q_L(f-f_r)/f_r}$$

wherein the resonant frequency $f_r$, the pre-loaded quality factor $Q_L$ and the coupling coefficient k are curve fitting parameters from the above least squares algorithm.

2. The method of claim 1, wherein the cavity resonance mode belongs to one of transverse magnetic field ($TM_{mnp}$) resonance modes, wherein m, n and p are integer values >0, and m is associated with the x-direction, n is associated with the y-direction and p is associated with the z-direction.

3. The method of claim 2, wherein maximum electric field strengths of the $TM_{mnp}$ resonance modes take place at or proximal to wall surfaces of the enclosed resonant waveguide cavity.

4. The method of claim 3, wherein the maximum electric field strengths of the $TM_{mnp}$ resonance modes at or proximal to the wall surfaces of the enclosed resonant waveguide cavity eliminates use of fixturing support to partially or fully suspend the sample away from the surface of the bottom wall.

5. The method of claim 2, wherein the cavity resonance mode belongs to a $TM_{120}$ resonance mode which is a lowest $TM_{mnp}$ resonance mode having the first resonance frequency $f_o$ at approximately 86.5 GHz.

6. The method of claim 4, wherein the elimination of fixturing support and the direct placement of the sample on the surface of the bottom wall of the enclosed resonant waveguide cavity enables the sample to receive maximum electric field strengths and perturbation of electric fields, thus improving sensitivity of the measurement of the resonance frequency shift ($f_s$-$f_o$) and improving accuracy in complex permittivity ε determinations for the identifying of the sample.

7. The method of claim 1, wherein the enclosed resonant waveguide cavity supports transverse electric field ($TE_{mnp}$) resonance modes, wherein maximum electric field strengths of the $TE_{mnp}$ resonance modes take place at a distance away from wall surfaces or towards a centroid of the enclosed resonant waveguide cavity.

8. The method of claim 7, wherein when measurement is made in $TE_{mnp}$ resonance modes, fixturing support is required in order to partially suspend the sample or to place the sample away from wall surfaces toward the centroid of the enclosed resonant waveguide cavity, such that the sample receiving maximum electric field strengths and perturbation of electric fields.

9. The method of claim 8, wherein the requirement of fixturing support to suspend the sample in the enclosed resonant waveguide cavity adds to the perturbation of the electric fields and weakening of the electric field strengths, thus degrading sensitivity of the measurement of the resonance frequency shift ($f_s$-$f_o$) and increasing variations in complex permittivity c determinations for the identifying of the sample.

10. The method of claim 1, wherein the enclosed resonant waveguide cavity is rectangular cuboidal shape having electrically conductive wall, including: four surrounding walls, a removable top wall and the bottom wall, wherein the removable top wall having an aperture which is coupled to the network analyzer through a waveguide.

11. The method of claim 1, wherein the sample is a sub-microliter volume sample in one of physical states comprising: a solid state, a liquid state and a gel state.

12. The method of claim 7, wherein the sample in the liquid state is being dispensed using a sub-microliter pipette for handling consistency and sample size control.

13. The method of claim 1, wherein after the placement of the sample on the surface of a bottom wall of the enclosed resonant waveguide cavity, further comprising determining one or more of:
- a sample mass, by taking a mass difference of the enclosed resonant waveguide cavity before and after the sample is placed,
- a change of sample placement location, by comparing the sample placement location in the enclosed resonant waveguide cavity before and after the second resonance frequency $f_s$ is made,
- a change of sample physical dimensions, by comparing the sample physical dimensions in the enclosed resonant waveguide cavity before and after the second resonance frequency $f_s$ is made.

14. The method of claim 13, wherein the change of sample placement location and the change of sample physical dimensions are measured through optical means.

15. The method of claim 1, comprising calibrating the network analyzer at a defined power level over the defined millimeter wave frequency range using calibration standards of a short, an open and a 50 ohm load termination.

16. The method of claim 1, wherein the shift in frequency $f_s$-$f_o$, the unloaded quality factor $Q_o$ and the sample loaded quality factor $Q_s$ are related by the following equation:

$$\frac{\omega_s - \omega_0}{\omega_0} = \frac{f_s - f_0}{f_0} + \frac{i}{2}\left(\frac{1}{Q_s} - \frac{1}{Q_0}\right)$$

where $\omega_o$ is a complex resonant radian frequency of the enclosed resonant waveguide cavity free from the sample, and $\omega_s$, is a complex resonant radian frequency of the enclosed resonant waveguide cavity having the sample, and i is an imaginary number, $f_o$ is the first resonance frequency and $f_s$ is the second resonance frequency at the cavity resonance mode.

17. The method of claim 1, wherein the real part ε', the shift in frequency $f_s$-$f_o$ and the internal dimensional measurements a, b and d are related by the following equations:

$$\frac{f_s - f_0}{f_0} = \frac{(1-\varepsilon')t\left[A\pi + a\sin\left(\frac{A\pi}{a}\right)\right]\left[B\pi - b\sin\left(\frac{B\pi}{b}\right)\right]}{4abd\pi^2}.$$

18. The method of claim 1, wherein the imaginary part ε", the unloaded quality factor $Q_o$ and the sample loaded quality factor $Q_s$ are related by the following equations:

$$\frac{1}{2}\left(\frac{1}{Q_s} - \frac{1}{Q_0}\right) = \frac{(1-\varepsilon'')t\left[A\pi + a\sin\left(\frac{A\pi}{a}\right)\right]\left[B\pi - b\sin\left(\frac{B\pi}{b}\right)\right]}{4abd\pi^2}.$$

19. The method of claim 1, wherein $$\varepsilon'_s = \frac{V_0(f_0 - f_s)}{2V_s f_s} + 1,$$

$$\varepsilon''_s = \frac{V_0(Q_0 - Q_s)}{4V_s Q_0 Q_s},$$

where $\varepsilon'_s$ and $\varepsilon''_s$ are the real part ε' and the imaginary part ε" of the complex permittivity c for perturbation of the sample, the first resonance frequency $f_o$ and unloaded quality factor $Q_o$ refer to the unperturbed (or unloaded) resonant cavity, and the second resonance frequency $f_s$ and the sample loaded quality factor $Q_s$ refer to values perturbed (or loaded) by the sample, and $V_o$ is a volume of the cavity and $V_s$ is a sample volume.

20. The method of claim 1, wherein the enclosed resonant waveguide cavity being an upside down resonant cavity having a centered aperture disposed in an xy plane at a removable top wall, wherein the removable top wall is disposed directly opposite and away from the bottom wall in the z-direction, and the aperture being an input configured to be coupled to a waveguide to receive the signals from the network analyzer to analyze the sample.

21. The method of claim 20, wherein the enclosed resonant waveguide cavity in an xz direction comprising a removable top cover as the only accessible opening configured to receive the sample for analysis and identification.

22. The method of claim 20, wherein the aperture disposed in the xy plane at the removable top wall being circular.

23. A computer executable algorithm stored on a non-transitory computer-readable memory medium, when executed by a processor on a computer, causes a network analyzer to perform operations to measure microliter volume size sample, comprising:
sending signals over a defined millimeter wave frequency range which operates over a W-band covering 75 GHz to 110 GHz to an enclosed resonant waveguide cavity which is free from samples wherein the enclosed resonant waveguide cavity having an internal dimensional measurements of a in x-direction, b in y-direction and d in z-direction;
measuring first returned signals in the defined millimeter wave frequency range from the enclosed resonant waveguide cavity to determine at least a first resonance frequency $f_o$ at a cavity resonance mode;

determining according to the first returned signals in the defined millimeter wave frequency range, an unloaded quality factor $Q_o$ of the enclosed resonant waveguide cavity which is free from sample;

sending the signals over the defined millimeter wave frequency range operating over the W-band covering 75 GHz to 110 GHz to the enclosed resonant waveguide cavity loaded with the microliter volume size sample; wherein the sample is placed on a surface of a bottom wall of the enclosed resonant waveguide cavity, wherein the surface of the bottom wall is at a zero elevation in the z-direction;

measuring a second returned signals in the defined millimeter wave frequency range from the enclosed resonant waveguide cavity loaded with the sample therein to determine at least a second resonance frequency $f_s$ at the cavity resonance mode, and determining according to the second returned signals in the defined millimeter wave frequency range, a sample loaded quality factor $Q_s$ of the enclosed resonant waveguide cavity;

determining, a resonance frequency shift $(f_s-f_o)$, by taking a difference between the second resonance frequency $f_s$ and the first resonance frequency $f_o$ at the cavity resonance mode;

determining a complex permittivity $\varepsilon=\varepsilon'=i\varepsilon''$ of the sample according to at least: the resonance frequency shift $\Delta f=(f_s-f_o)$, the sample loaded quality factor $Q_s$, the unloaded quality factor $Q_o$ and the internal dimensional measurements a, b and d of the enclosed resonant waveguide cavity;

wherein $\varepsilon'$ is a real part and $\varepsilon''$ is an imaginary part; and identifying the sample using a database according to the determined complex permittivity $\varepsilon$, wherein the unloaded quality factor $Q_o$ or the sample loaded quality factor $Q_s$ are related by the following equations:

$$Q_0 = Q_L(1+k)$$

$$Q_L = \frac{f_r}{f_{FWHM}}$$

where $Q_o$ is another unloaded quality factor for one of: $Q_s$ and $Q_o$, and the another unloaded quality factor $Q_o$ being free from loading effect or losses caused by measurement set-up and connections to the network analyzer, where $Q_L$ is a pre-loaded quality factor, and the pre-loaded quality factor $Q_L$ including the loading effect or the losses caused by the measurement set-up and connections to the network analyzer, wherein k is a coupling coefficient, where, $f_r$ is the resonant frequency, being one of: $f_s$ and $f_o$; and $f_{FWHM}$ is the full-width-half-maximum frequency or a 3dB frequency bandwidth, wherein the pre-loaded quality factor $Q_L$ is alternately calculated using a least squares algorithm to the following function:

$$ref\ coef = -1 + \frac{2k/(1+k)}{1+i2Q_L(f-f_r)/f_r}$$

wherein the resonant frequency $f_r$, the pre-loaded quality factor $Q_L$ and the coupling coefficient k are curve fitting parameters from the above least squares algorithm.

24. The computer executable algorithm of claim 23, wherein the enclosed resonant waveguide cavity being an upside down resonant cavity having a centered circular aperture disposed in an xy plane at a removable top wall, wherein the removable top wall is disposed directly opposite and away from the bottom wall in the z-direction, and the aperture being an input configured to be coupled to a waveguide to receive the signals from the network analyzer to analyze the sample.

25. The computer executable algorithm of claim 24, wherein the enclosed resonant waveguide cavity in an xz direction comprising a removable top cover as the only accessible opening configured to receive the sample for analysis and identification.

26. A computer implemented algorithm stored on a non-transitory computer-readable memory medium, when executed by a processor on a computer, the algorithm causes the computer to measure microliter volume size sample, by performing steps comprising:

controlling a network analyzer to send signals over a defined millimeter wave frequency range which operates over a W-band covering 75 GHz to 110 GHz to an enclosed resonant waveguide cavity is free from sample to measure first returned signals in the defined millimeter wave frequency range from the enclosed resonant waveguide cavity to determine at least a first resonance frequency fo at a cavity resonance mode, wherein the enclosed resonant waveguide cavity having internal dimensional measurements of a in x-direction, b in y-direction and d in z-direction;

determining a complex permittivity $\varepsilon=\varepsilon'+i\varepsilon''$ of the microliter volume size sample placed on a surface of a bottom wall of the enclosed resonant waveguide cavity, wherein the determining comprising the steps of:

determining a change in complex resonant radian frequency $\omega_s-\omega_o$ over the defined millimeter wave frequency range due to insertion of the sample in the enclosed resonant waveguide cavity, wherein the change in the complex resonant radian frequency $\omega_s-\omega_o$ is according to equation (1):

$$\frac{\omega_s - \omega_0}{\omega_0} = \frac{\iiint_{V_{sample}} \Delta\varepsilon|E_z|^2 dv}{\iiint_{V_{cavity}} \varepsilon|E_z|^2 dv}$$

where $V_{cavity}$ is a cavity volume and $V_{sample}$ is a sample volume, $E_z$ is a uniform electric field in the z direction throughout a depth d in the z direction of the enclosed resonant waveguide cavity when a resonant mode integer p is equal to 0 for a $TM_{120}$ mode, wherein the $\omega_s$ and $\omega_o$ are resonant radian frequencies of the enclosed resonant waveguide cavity with and without the sample, respectively, where the and $\varepsilon=\varepsilon'+i\varepsilon''$ are real part and imaginary part of the complex permittivity $\varepsilon$;

performing an integral to a numerator of equation (1) to yield equation (2):

$$(\varepsilon-1)\varepsilon_0 \int_0^a \int_0^b \int_0^c E_0^2 \sin^2\left(\frac{\pi x}{a}\right)\sin^2\left(\frac{2\pi y}{b}\right)\cos^2(0)dzdydx =$$

-continued $$\frac{(\varepsilon-1)\varepsilon_0 E_0^2 \left[A\pi + a\sin\left(\frac{A\pi}{a}\right)\right]\left[B\pi - b\sin\left(\frac{B\pi}{b}\right)\right]t}{8\pi^2},$$

where $\varepsilon_o$ is permittivity of air;
performing an integral to a denominator of equation (1) to yield equation (3):

$$\frac{\varepsilon_0 E_0^2 abd}{2}$$

substituting equations (2) and (3) into (1) to yield equations (4):

$$\frac{\omega_s - \omega_0}{\omega_0} = \frac{(1-\varepsilon)t\left[A\pi + a\sin\left(\frac{A\pi}{a}\right)\right]\left[B\pi - b\sin\left(\frac{B\pi}{b}\right)\right]}{4abd\pi^2},$$

wherein a complex quality factor Q is related to the complex resonant radian frequency of $\omega_s$ and $\omega_o$ through equation (5):

$$Q = \frac{\omega_R}{2\omega_I}$$

where $\omega_R$ and $\omega_I$ are a real part and an imaginary part of the complex resonant radian frequency;
substituting equation (5) into equation (1) to yield equation (6):

$$\frac{\omega_s - \omega_0}{\omega_0} = \frac{f_s - f_0}{f_0} + \frac{i}{2}\left(\frac{1}{Q_s} - \frac{1}{Q_0}\right)$$

wherein the real part $\varepsilon'$, a shift in frequency $f_s - f_o$ and the internal dimensional measurements a, b and d are related by the following equations:

$$\frac{f_s - f_0}{f_0} = \frac{(1-\varepsilon')t\left[A\pi + a\sin\left(\frac{A\pi}{\alpha}\right)\right]\left[B\pi - b\sin\left(\frac{B\pi}{b}\right)\right]}{4abd\pi^2}$$

and combining equation (4) and (6) to yield equation (7):

$$\frac{1}{2}\left(\frac{1}{Q_s} - \frac{1}{Q_0}\right) = \frac{(1-\varepsilon'')t\left[A\pi + a\sin\left(\frac{A\pi}{a}\right)\right]\left[B\pi - b\sin\left(\frac{B\pi}{b}\right)\right]}{4abd\pi^2},$$

wherein $Q_o$ is an unloaded quality factor of the enclosed resonant waveguide cavity which is free from the sample, and $Q_s$ is a sample loaded quality factor of the enclosed resonant waveguide cavity having the sample;
wherein the unloaded quality factor $Q_o$ or the sample loaded quality factor $Q_s$ are related by the following equations:

$$Q_0 = Q_L(1+k)$$

$$Q_L = \frac{f_r}{f_{FWHM}}$$

where $Q_o$ is another unloaded quality factor for one of: $Q_s$ and $Q_o$, and the another unloaded quality factor $Q_o$ being free from loading effect or losses caused by measurement set-up and connections to the network analyzer,
where $Q_L$ is a pre-loaded quality factor, and the pre-loaded quality factor $Q_L$ including the loading effect or losses caused by the measurement set-up and connections to the network analyzer,
wherein k is a coupling coefficient,
where, $f_r$ is the resonant frequency, being one of: $f_s$ and $f_o$; and
$f_{FWHM}$ is the full-width-half-maximum frequency or a 3dB frequency bandwidth,
wherein the pre-loaded quality factor $Q_L$ is alternately calculated using a least squares algorithm to the following function:

$$ref\ coef = -1 + \frac{2k/(1+k)}{1 + i2Q_L(f-f_r)/f_r}$$

wherein the resonant frequency $f_r$, the pre-loaded quality factor $Q_L$ and the coupling coefficient k are curve fitting parameters from the above least squares algorithm;
determining the real part $\varepsilon'$ and the imaginary part $\varepsilon''$ according to equations (4) and (7); and
determining the complex permittivity according to $\varepsilon = \varepsilon' + i\varepsilon''$; and
identify the sample using a database according to the determined complex permittivity $\varepsilon$.

27. The computer implemented algorithm of claim 26, wherein $$\varepsilon'_s = \frac{V_0(f_0 - f_s)}{2V_s f_s} + 1,$$

$$\varepsilon''_s = \frac{V_0(Q_0 - Q_s)}{4V_s Q_0 Q_s},$$

where $\varepsilon_s'$ and $\varepsilon_s''$ are the real part $\varepsilon_s'$ and the imaginary part $\varepsilon_s''$ of the complex permittivity $\varepsilon$ for perturbation of the sample, the first resonance frequency $f_o$ and unloaded quality factor $Q_o$ refer to the unperturbed (or unloaded) resonant cavity, and the second resonance frequency $f_s$ and the sample loaded quality factor $Q_s$ refer to values perturbed (or loaded) by the sample, and $V_o$ is the cavity volume $V_{cavity}$ and $V_s$ is the sample volume $V_{sample}$ in equation (1).

28. The computer implemented algorithm of claim 24, wherein the enclosed resonant waveguide cavity being an upside down resonant cavity having a centered circular aperture disposed in an xy plane at a removable top wall, wherein the removable top wall is disposed directly opposite and away from the bottom wall in the z-direction, and the aperture being an input configured to be coupled to a waveguide to receive the signals from the network analyzer to analyze the sample.

29. The computer implemented algorithm of claim 28, wherein the enclosed resonant waveguide cavity in an xz direction comprising a removable top cover as the only accessible opening configured to receive the sample for analysis and identification.

30. A method of microliter volume size sample identification, comprising:
coupling an enclosed resonant waveguide cavity which is free from sample to a network analyzer;
wherein the enclosed resonant waveguide cavity is rectangular cuboidal shape having electrically conducive wall, including: four surrounding walls, a removable top wall and a bottom wall, wherein the removable top wall having an aperture which is coupled to the network analyzer through a waveguide;
sending through the network analyzer, 75 GHz to 110 GHz frequency range millimeter wave signals to the enclosed resonant waveguide cavity to measure first returned signals from the enclosed resonant waveguide cavity to determine at least a first resonance frequency $f_o$ at a cavity resonance mode, wherein the enclosed resonant waveguide cavity having internal dimensional measurements of a in x-direction, b in y-direction and d in z-direction;
determining according to the first returned signals, an unloaded quality factor $Q_o$ of the enclosed resonant waveguide cavity which is free from sample;
placing a microliter volume size sample on a surface of the bottom wall of the enclosed resonant waveguide cavity, wherein the surface of the bottom wall is at a zero elevation in the z-direction;
sending through the network analyzer, the 75 GHz to 110 GHz frequency range millimeter wave signals to the enclosed resonant waveguide cavity loaded with the sample to measure a second returned signals from the enclosed resonant waveguide cavity loaded with the sample to determine at least a second resonance frequency $f_s$ at the cavity resonance mode,
determining according to the second returned signals, a sample loaded quality factor $Q_s$ of the enclosed resonant waveguide cavity;
determining, a resonance frequency shift ($f_s$- $f_o$), by taking a difference between the second resonance frequency $f_s$ and the first resonance frequency $f_o$ at the cavity resonance mode;
determining a complex permittivity $\varepsilon=\varepsilon'+i\varepsilon''$ of the sample according to at least: the resonance frequency shift $\Delta f=(f_s$- $f_o)$, the sample loaded quality factor $Q_s$, the unloaded quality factor $Q_o$ and the internal dimensional measurements a, b and d of the enclosed resonant waveguide cavity, where $\varepsilon'$ is a real part and $\varepsilon''$ is an imaginary part; and
identifying the sample using a database according to the determined complex permittivity $\varepsilon$, wherein the unloaded quality factor $Q_o$ or the sample loaded quality factor $Q_s$ are related by the following equations:

$$Q_0 = Q_L(1+k)$$

$$Q_L = \frac{f_r}{f_{FWHM}}$$

where $Q_o$ is another unloaded quality factor for one of: $Q_s$ and $Q_o$, and the another unloaded quality factor $Q_o$ being free from loading effect or losses caused by measurement set-up and connections to the network analyzer, where $Q_L$ is a pre-loaded quality factor, and the pre-loaded quality factor $Q_L$ including the loading effect or the losses caused by the measurement set-up and connections to the network analyzer, wherein: k is a coupling coefficient, $f_r$ is the resonant frequency being one of: $f_s$ and $f_o$;
and $f_{FWHM}$ is the full-width-half-maximum frequency or a 3dB frequency bandwidth.

31. The method of claim 30, wherein the pre-loaded quality factor $Q_L$ is alternately calculated using a least squares algorithm to the following function:

$$refcoef = -1 + \frac{2k/(1+k)}{1 + i2Q_L(f - f_r)/f_r}$$

wherein the resonant frequency $f_r$, the pre-loaded quality factor $Q_L$ and the coupling coefficient k are curve fitting parameters from the above least squares algorithm.

32. The method of claim 30, wherein the enclosed resonant waveguide cavity being an upside down resonant cavity having a centered circular aperture disposed in an xy plane at the removable top wall, wherein the removable top wall is disposed directly opposite and away from the bottom wall in the z-direction, and the aperture being an input configured to be coupled to a waveguide to receive the signals from the network analyzer to analyze the sample.

33. The method of claim 32, wherein the enclosed resonant waveguide cavity in an xz direction comprising a removable top cover as the only accessible opening configured to receive the sample for analysis and identification.

34. A computer executable algorithm stored on a non-transitory computer-readable memory medium, when executed by a processor on a computer, the algorithm causes the computer to measure microliter volume size sample, the computer performs steps comprising:
coupling an enclosed resonant waveguide cavity which is free from sample to a network analyzer;
wherein the enclosed resonant waveguide cavity is rectangular cuboidal shape having electrically conductive wall, including: four surrounding walls, a removable top wall and a bottom wall, wherein the removable top wall having an aperture which is coupled to the network analyzer through a waveguide;
sending through the network analyzer, 75 GHz to 110 GHz frequency range millimeter wave signals to the enclosed resonant waveguide cavity to measure first returned signals from the enclosed resonant waveguide cavity to determine at least a first resonance frequency $f_o$ at a cavity resonance mode, wherein the enclosed resonant waveguide cavity having internal dimensional measurements of a in x-direction, b in y-direction and d in z-direction;
determining according to the first returned signals, an unloaded quality factor $Q_o$ of the enclosed resonant waveguide cavity which is free from sample;
placing a microliter volume size sample on a surface of the bottom wall of the enclosed resonant waveguide cavity, wherein the surface of the bottom wall is at a zero elevation in the z-direction;
sending through the network analyzer, the 75 GHz to 110 GHz frequency range millimeter wave signals to the enclosed resonant waveguide cavity loaded with the sample to measure a second returned signals from the enclosed resonant waveguide cavity loaded with the sample to determine at least a second resonance frequency $f_s$ at the cavity resonance mode, determining according to the second returned signals, a sample loaded quality factor $Q_s$ of the enclosed resonant waveguide cavity;

determining, a resonance frequency shift ($f_s$-$f_o$), by taking a difference between the second resonance frequency $f_s$ and the first resonance frequency $f_o$ at the cavity resonance mode;

determining a complex permittivity $\varepsilon=\varepsilon'=i\varepsilon''$ of the sample according to at least: the resonance frequency shift $\Delta f=(f_s-f_o)$, the sample loaded quality factor $Q_s$, the unloaded quality factor $Q_o$ and the internal dimensional measurements a, b and d of the enclosed resonant waveguide cavity, where $\varepsilon'$ is a real part and $\varepsilon''$ is an imaginary part; and identifying the sample using a database according to the determined complex permittivity $\varepsilon$, wherein the unloaded quality factor $Q_o$ or the sample loaded quality factor $Q_s$ are related by the following equations:

$$Q_0 = Q_L(1+k)$$

$$Q_L = \frac{f_r}{f_{FWHM}}$$

where $Q_o$ is another unloaded quality factor for one of: $Q_s$ and $Q_o$, and the another unloaded quality factor $Q_o$ being free from loading effect or losses caused by measurement set-up and connections to the network analyzer, where $Q_L$ is a pre-loaded quality factor, and the pre-loaded quality factor $Q_L$ including the loading effect or the losses caused by the measurement set-up and connections to the network analyzer, wherein: k is a coupling coefficient, $f_r$ is the resonant frequency being one of: $f_s$ and $f_o$;

and $f_{FWHM}$ is the full-width-half-maximum frequency or a 3dB frequency bandwidth.

35. The computer executable algorithm of claim 34, wherein the pre-loaded quality factor $Q_L$ is alternately calculated using a least squares algorithm to the following function:

$$refcoef = -1 + \frac{2k/(1+k)}{1 + i2Q_L(f - f_r)/f_r}$$

wherein the resonant frequency $f_r$, the pre-loaded quality factor $Q_L$ and the coupling coefficient k are curve fitting parameters from the above least squares algorithm.

36. The computer executable algorithm of claim 34, wherein the cavity resonance mode belongs to one of transverse magnetic field ($TM_{mnp}$) resonance modes, wherein m, n and p are integer values >0, and m is associated with the x-direction, n is associated with the y-direction and p is associated with the z-direction.

37. The computer executable algorithm of claim 36, wherein maximum electric field strengths of the $TM_{mnp}$ resonance modes take place at or proximal to wall surfaces of the enclosed resonant waveguide cavity.

38. The computer executable algorithm of claim 37, wherein the maximum electric field strengths of the $TM_{mnp}$ resonance modes at or proximal to the wall surfaces of the enclosed resonant waveguide cavity eliminates use of fixturing support to partially or fully suspend the sample away from the surface of the bottom wall .

39. The computer executable algorithm of claim 36, wherein the cavity resonance mode belongs to a $TM_{120}$ resonance mode which is a lowest $TM_{mnp}$ resonance mode having the first resonance frequency $f_o$ at approximately 86.5 GHz.

40. The computer executable algorithm of claim 38, wherein the elimination of fixturing support and the direct placement of the sample on the surface of the bottom wall of the enclosed resonant waveguide cavity enables the sample to receive maximum electric field strengths and perturbation of electric fields, thus improving sensitivity of the measurement of the resonance frequency shift ($f_s$-$f_o$) and improving accuracy in complex permittivity $\varepsilon$ determinations for the identifying of the sample.

41. The computer executable algorithm of claim 34, wherein the enclosed resonant waveguide cavity supports transverse electric field ($TE_{mnp}$) resonance modes, wherein maximum electric field strengths of the $TE_{mnp}$ resonance modes take place at a distance away from wall surfaces or towards a centroid of the enclosed resonant waveguide cavity.

42. The computer executable algorithm of claim 41, wherein when measurement is made in $TE_{mnp}$ resonance modes, fixturing support is required in order to partially suspend the sample or to place the sample away from wall surfaces toward the centroid of the enclosed resonant waveguide cavity, such that the sample receiving maximum electric field strengths and perturbation of electric fields.

43. The computer executable algorithm of claim 42, wherein the requirement of fixturing support to suspend the sample in the enclosed resonant waveguide cavity adds to the perturbation of the electric fields and weakening of the electric field strengths, thus degrading sensitivity of the measurement of the resonance frequency shift ($f_s$-$f_o$) and increasing variations in complex permittivity c determinations for the identifying of the sample.

44. The computer executable algorithm of claim 34, wherein the enclosed resonant waveguide cavity is rectangular cuboidal shape having electrically conductive wall, including: four surrounding walls, the removable top wall and the bottom wall, wherein the removable top wall having an aperture which is coupled to the network analyzer through a waveguide.

45. The computer executable algorithm of claim 34, wherein after the placement of the sample on the surface of the bottom wall of the enclosed resonant waveguide cavity, further comprising determining one or more of:

a sample mass, by taking a mass difference of the enclosed resonant waveguide cavity before and after the sample is placed, a change of sample placement location, by comparing the sample placement location in the enclosed resonant waveguide cavity before and after the second resonance frequency $f_s$ is made, a change of sample physical dimensions, by comparing the sample physical dimensions in the enclosed resonant waveguide cavity before and after the second resonance frequency $f_s$ is made.

46. The computer implemented algorithm of claim 34, wherein $$\varepsilon'_s = \frac{V_0(f_0 - f_s)}{2V_s f_s} + 1,$$

-continued $$\varepsilon_s'' = \frac{V_0(Q_0 - Q_s)}{4V_s Q_0 Q_s},$$

where $\varepsilon'_s$ and $\varepsilon''_s$ are the real part and the imaginary part $\varepsilon''$ of the complex permittivity $\varepsilon$ for perturbation of the sample, the first resonance frequency $f_o$ and unloaded quality factor $Q_o$, refer to the unperturbed (or unloaded) resonant cavity, and the second resonance frequency $f_s$ and the sample loaded quality factor $Q_s$ refer to values perturbed (or loaded) by the sample, and is a volume of the $V_{cavity}$ and $V_s$ is a $V_{sample}$ volume (1).

47. The computer executable algorithm of claim 37, wherein the enclosed resonant waveguide cavity being an upside down resonant cavity having a centered circular aperture disposed in an xy plane at the removable top wall, wherein the removable top wall is disposed directly opposite and away from the bottom wall in the z-direction, and the aperture being an input configured to be coupled to a waveguide to receive the signals from the network analyzer to analyze the sample.

48. The computer executable algorithm of claim 47, wherein the enclosed resonant waveguide cavity in an xz direction comprising a removable top cover as the only accessible opening configured to receive the sample for analysis and identification.

49. The computer executable algorithm of claim 34, wherein after the placement of the sample on the surface of the bottom wall of the enclosed resonant waveguide cavity, further comprising determining a sample mass, by taking a mass difference of the enclosed resonant waveguide cavity before and after the sample is placed.

50. The computer executable algorithm of claim 34, wherein after the placement of the sample on the surface of the bottom wall of the enclosed resonant waveguide cavity, further comprising determining a change of sample placement location, by comparing the sample placement location in the enclosed resonant waveguide cavity before and after the second resonance frequency $f_s$ is made.

51. The computer executable algorithm of claim 34, wherein after the placement of the sample on the surface of the bottom wall of the enclosed resonant waveguide cavity, further comprising determining a change of sample physical dimensions, by comparing the sample physical dimensions in the enclosed resonant waveguide cavity before and after the second resonance frequency $f_s$ is made.

52. A computer implemented algorithm stored on a non-transitory computer-readable memory medium, when executed by a processor on a computer, the algorithm causes the computer to measure microliter volume size sample, by performing steps comprising:
controlling a network analyzer to send 75 GHz to 110 GHz frequency range millimeter wave signals to an enclosed resonant waveguide cavity is free from sample to measure first returned signals from the enclosed resonant waveguide cavity to determine at least a first resonance frequency fo at a cavity resonance mode, wherein the enclosed resonant waveguide cavity having internal dimensional measurements of a in x-direction, b in y-direction and d in z-direction;
determining a complex permittivity $\varepsilon=\varepsilon'+i\varepsilon''$ of the microliter volume size sample placed on a surface of a bottom wall of the enclosed resonant waveguide cavity, wherein the determining comprising the steps of:
determining a change in complex resonant radian frequency $\omega_s - \omega_o$ due to insertion of the sample in the enclosed resonant waveguide cavity, wherein the change in the complex resonant radian frequency $\omega_s - \omega_o$ is according to equation (1):

$$\frac{\omega_s - \omega_0}{\omega_0} = \frac{-\iiint_{V_{sample}} \Delta\varepsilon |E_z|^2 dv}{\iiint_{V_{cavity}} \varepsilon |E_z|^2 dv}$$

where $V_{cavity}$ is a cavity volume and $V_{sample}$ is a sample volume, $E_z$ is a uniform electric field in the z direction throughout a depth d in the z direction of the enclosed resonant waveguide cavity when a resonant mode integer p is equal to 0 for a $TM_{120}$ mode, wherein the $\omega_s$ and $\omega_o$ are resonant radian frequencies of the enclosed resonant waveguide cavity with and without the sample, respectively, where the $\varepsilon'$ and $\varepsilon''$ are real part and imaginary part of the complex permittivity $\varepsilon$;
wherein a complex quality factor Q is related to the complex resonant radian frequency of $\omega_s$ and $\omega_o$ through equation (5):

$$Q = \frac{\omega_E}{2\omega_z}$$

where $\omega_E$ and $\omega_i$ are a real part and an imaginary part of the complex resonant radian frequency;
substituting equation (5) into equation (1) to yield equation (6):

$$\frac{\omega_z - \omega_0}{\omega_0} = \frac{f_s - f_z}{f_0} + \frac{t}{2}\left(\frac{1}{Q_s} - \frac{1}{Q_0}\right)$$

wherein $Q_o$ is an unloaded quality factor of the enclosed resonant waveguide cavity which is free from the sample, and $Q_s$ is a sample loaded quality factor of the enclosed resonant waveguide cavity having the sample;
wherein the unloaded quality factor $Q_o$ or the sample loaded quality factor $Q_s$ are related by the following equations:

$$Q_0 = Q_L(1+k)$$

$$Q_L = \frac{f_r}{f_{FWHM}}$$

where $Q_o$ is another unloaded quality factor for one of: $Q_s$ and $Q_o$, and the another unloaded quality factor $Q_o$ being free from loading effect or losses caused by measurement set-up and connections to the network analyzer,
where $Q_L$ is a pre-loaded quality factor, and the pre-loaded quality factor $Q_L$ including the loading effect or losses caused by the measurement set-up and connections to the network analyzer,
wherein k is a coupling coefficient, $f_r$ is the resonant frequency, being one of: $f_s$ and $f_o$; and
$f_{FWHM}$ is the full-width-half-maximum frequency or a 3dB frequency bandwidth.

53. The computer implemented algorithm of claim 52, comprising performing an integral to a numerator of equation (1) to yield equation (2):

$$(\varepsilon-1)\varepsilon_0 \int_0^a \int_0^b \int_0^c E_0^2 \sin^2\left(\frac{\pi x}{a}\right)\sin^2\left(\frac{2\pi y}{b}\right)\cos^2(0)dzdydx =$$

$$\frac{(\varepsilon-1)\varepsilon_0 E_0^2 \left[A\pi + a\sin\left(\frac{A\pi}{a}\right)\right]\left[B\pi - b\sin\left(\frac{B\pi}{b}\right)\right]t}{8\pi^2}$$

where $\varepsilon_o$, is permittivity of air;

performing an integral to a denominator of equation (1) to yield equation (3):

$$\frac{\varepsilon_0 E_0^2 abd}{2}$$

substituting equations (2) and (3) into (1) to yield equations (4):

$$\frac{\omega_s - \omega_0}{\omega_0} = \frac{(1-\varepsilon)t\left[A\pi + a\sin\left(\frac{A\pi}{a}\right)\right]\left[B\pi - b\sin\left(\frac{B\pi}{b}\right)\right]}{4abd\pi^2}.$$

54. The computer implemented algorithm of claim 53, wherein the real part $\varepsilon'$, a shift in frequency $f_s - f_o$ and the internal dimensional measurements a, b and d are related by the following equations:

$$\frac{f_s - f_0}{f_0} = \frac{(1-\varepsilon')t\left[A\pi + a\sin\left(\frac{A\pi}{a}\right)\right]\left[B\pi - b\sin\left(\frac{B\pi}{b}\right)\right]}{4abd\pi^2}$$

and combining equation (4) and (6) to yield equation (7):

$$\frac{1}{2}\left(\frac{1}{Q_s} - \frac{1}{Q_0}\right) = \frac{(1-\varepsilon'')t\left[A\pi + a\sin\left(\frac{A\pi}{a}\right)\right]\left[B\pi - b\sin\left(\frac{B\pi}{b}\right)\right]}{4abd\pi^2}.$$

55. The computer implemented algorithm of claim 54, wherein the pre-loaded quality factor $Q_L$ is alternately calculated using a least squares algorithm to the following function:

$$refcoef = -1 + \frac{2k/(1+k)}{1 + i2Q_L(f-f_r)/f_r}$$

wherein the resonant frequency $f_r$, the pre-loaded quality factor $Q_L$ and the coupling coefficient k are curve fitting parameters from the above least squares algorithm;

determining the real part $\varepsilon'$ and the imaginary part $\varepsilon''$ according to equations (4) and (7); and determining the complex permittivity according to $\varepsilon = \varepsilon'' + \varepsilon''$; and identify the sample using a database according to the determined complex permittivity $\varepsilon$.

56. The computer implemented algorithm of claim 52, wherein $$\varepsilon'_s = \frac{V_0(f_0 - f_s)}{2V_s f_s} + 1,$$

$$\varepsilon''_s = \frac{V_0(Q_0 - Q_s)}{4V_s Q_0 Q_s},$$

where $\varepsilon'_s$ and $\varepsilon''_s$ are the real part and the imaginary part $\varepsilon''$ of the complex permittivity $\varepsilon$ for perturbation of the sample, the first resonance frequency $f_o$ and unloaded quality factor $Q_o$ refer to the unperturbed (or unloaded) resonant cavity, and the second resonance frequency $f_s$ and the sample loaded quality factor $Q_s$ refer to values perturbed (or loaded) by the sample, and is the cavity volume $V_{cavity}$ and $V_s$, is the sample volume $V_{sample}$ in equation (1).

57. The computer implemented algorithm of claim 52, wherein the enclosed resonant waveguide cavity being an upside down resonant cavity having a centered circular aperture disposed in an xy plane at a removable top wall, wherein the removable top wall is disposed directly opposite and away from the bottom wall in the z-direction, and the aperture being an input configured to be coupled to a waveguide to receive the signals from the network analyzer to analyze the sample.

58. The computer implemented algorithm of claim 57, wherein the enclosed resonant waveguide cavity in an xz direction comprising a removable top cover as the only accessible opening configured to receive the sample for analysis and identification.

* * * * *